United States Patent
Shin et al.

(10) Patent No.: US 7,804,382 B2
(45) Date of Patent: Sep. 28, 2010

(54) TUNABLE RESONATOR USING FILM BULK ACOUSTIC RESONATOR (FBAR)

(75) Inventors: Jea-Shik Shin, Suwon-Si (KR); Yun-Kwon Park, Dongducheon-Si (KR); In-Sang Song, Seoul (KR); Duck-Hwan Kim, Goyang-Si (KR); Chul-Soo Kim, Hwaseong-Si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 308 days.

(21) Appl. No.: 12/048,481

(22) Filed: Mar. 14, 2008

(65) Prior Publication Data

US 2009/0115553 A1  May 7, 2009

(30) Foreign Application Priority Data

Nov. 1, 2007  (KR) .................... 10-2007-0111060

(51) Int. Cl.
H03H 9/13   (2006.01)
H03H 9/15   (2006.01)
H03H 9/54   (2006.01)
H03H 3/04   (2006.01)

(52) U.S. Cl. .................. 333/188; 333/187; 310/312
(58) Field of Classification Search .............. 333/187, 333/188; 310/312
See application file for complete search history.

(56) References Cited

U.S. PATENT DOCUMENTS 6,204,737 B1 * 3/2001 Ella ........................ 333/187
7,372,346 B2 * 5/2008 Tilmans et al. ............ 333/187
2006/0197411 A1 * 9/2006 Hoen et al. ................ 310/320

FOREIGN PATENT DOCUMENTS

FR         2 911 448 A1 *  7/2008

OTHER PUBLICATIONS

M. El Hassan et al.; "A Study on FBAR Filters Reconfiguration"; 12th IEEE International Conference on Electronics, Circuits and Systems; Dec. 11-12, 2005, pp. 1-4.*
E.R. Brown; "RF-MEMS Switches for Reconfigurable Integrated Circuits"; IEEE Transactions on Microwave Theory and Techniques, vol. 46, No. 11, Nov. 1998, pp. 1868-1880.*
J.R. Reid et al.; "RF Actuation of Capacitive MEMS Switches"; 2003 IEEE MTT-S International Microwave Symposium Digest; Jun. 8-13, 2003; vol. 3, pp. 1919-1922.*
W. Pang et al.; "Electrically Tunable and Switchable Film Bulk Acousitc(sic) Resonator"; 2004 IEEE International Ultrasonics, Ferroelectrics, and Frequency Control Joint 50th Anniversary Conference, Frequency Control Symposium and Exposition; Aug. 23-27, 2004, pp. 22-26.*

(Continued)

Primary Examiner—Barbara Summons
(74) Attorney, Agent, or Firm—NSIP Law (57) ABSTRACT

A tunable resonator is provided. The tunable resonator includes a film bulk acoustic resonator (FBAR) for performing a resonance, and at least one driver which is arranged at a side of the FBAR and is deformed and brought into contact with the FBAR by an external signal, thereby changing a resonance frequency of the FBAR. Accordingly, a multiband integration and a one-chip manufacture can be implemented simply using a micro electro mechanical system (MEMS) technology and a mass production is possible.

17 Claims, 7 Drawing Sheets

OTHER PUBLICATIONS

P. Robert et al.; "Integrated RF-MEMS Switch Based on a Combination of Thermal and Electrostatic Actuation"; Transducers '03, The 12th International Conference on Solid State Sensors, Actuators and Microsystems, Boston, Jun. 8-12, 2003; vol. 2, pp. 1714-1717.*

M. El Hassan et al.; "A Multistandard RF Receiver Front-End Using a Reconfigurable FBAR Filter"; 2006 IEEE North-East Workshop on Circuits and Systems; Jun. 2006, pp. 173-176.*

W. Pang et al.; "Electrically Tunable and Temperature Compensated FBAR"; 2005 IEEE MTT-S International Microwave Symposium Digest; Jun. 12-17, 2005, pp. 1279-1282.*

Citation and Abstract only, with Publication Date, for the El Hassan et al. article "A Study on FBAR Filters Reconfiguration"; 12th International Conference on Electronics, Circuits and Systems, ICECS 2005; Dec. 11-14, 2005, one page with URL.*

* cited by examiner

TUNABLE RESONATOR USING FILM BULK ACOUSTIC RESONATOR (FBAR)

CROSS-REFERENCE TO RELATED APPLICATIONS

This application claims the benefit under 35 U.S.C. §119 (a) of Korean Patent Application No. 10-2007-0111060, filed on Nov. 1, 2007, in the Korean Intellectual Property Office, the entire disclosure of which is hereby incorporated by reference.

BACKGROUND OF THE INVENTION

1. Field of the Invention

The present invention relates to a tunable resonator, and more particularly, to a tunable resonator which changes a resonance frequency of a film bulk acoustic resonator (FBAR), thereby fulfilling a multiband operation.

2. Description of the Related Art

In recent, wireless communication technologies have rapidly progressed to realize a so-called ubiquitous society. Also, high-speed and high-advanced wireless communication environments and compact-sized wireless communication terminals such as mobile terminals have been increasingly demanded. With this development of wireless communication technologies, the radio frequency-micro electro mechanical system (RF-MEMS) technology makes it possible to realize the high-advanced and compact-sized wireless device. The RF-MEMS technology refers to a technology that manufactures a mechanical micro structure mainly on a semiconductor substrate, thereby realizing high performance and compact-sizing that could not be obtained by a semiconductor device. Example of the devices using the RF-MEMS technology is a tunable capacitor, a switch, a film bulk acoustic resonator (FBAR).

The FBAR refers to a resonator that comprises a lower electrode, a piezoelectric layer, and an upper electrode which are laminated in sequence. If an electric energy is applied to both the electrodes, an acoustic wave is generated due to the piezoelectric effect and accordingly a resonance is generated.

Figure 1:
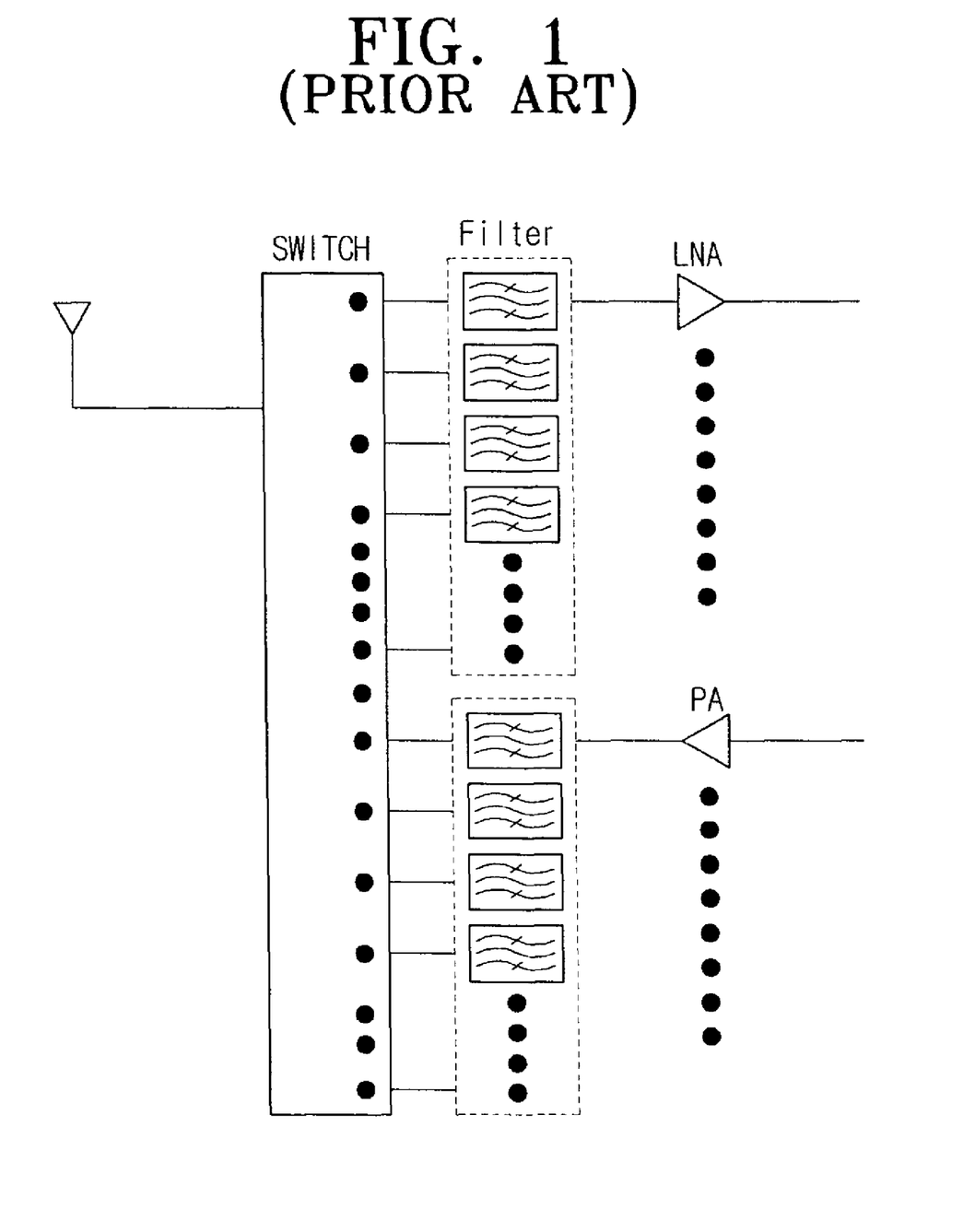
FIG. 1 is a view illustrating a conventional RF front end.

FIG. 1 is a view illustrating a conventional RF front end. Referring to FIG. 1, a conventional RF duplexer has to have a plurality of filters to transmit and receive information using various frequency bands. These filters generally use a FBAR. In the filters using a general FBAR, a frequency range is determined based on the thickness of a resonator comprising a piezoelectric layer and a plurality of electrode layers. However, the filter using a general FBAR has a limitation in the etching of thickness and the frequency cannot be tuned if it has been once tuned. Therefore, there is a problem that a multiband operation cannot be fulfilled. Also, since the plurality of filters is required as shown in FIG. 1, it is difficult to realize a compact-sized device.

SUMMARY OF THE INVENTION

Exemplary embodiments of the present invention address at least the above problems and/or disadvantages and provide at least the advantages described below. Accordingly, an aspect of the present invention is to provide a RF tunable resonator which is capable of fulfilling a multiband operation using a film bulk acoustic resonator (FBAR).

In order to achieve the above-described aspects of the present invention, a radio frequency (RF) tunable resonator is provided, which includes a FBAR for performing a resonance, and at least one driver which is arranged at a side of the FBAR and is deformed and brought into contact with the FBAR by an external signal, thereby changing a resonance frequency of the FBAR.

The tunable resonator may further include a substrate for supporting the FBAR and the at least one driver.

The at least one driver may be of a cantilever structure such that one end of the driver is in contact with a surface of the substrate and the other is distanced away from the surface of the substrate above the FBAR.

The at least one driver may be of a bridge structure such that opposite ends of the driver are in contact with a surface of the substrate and a certain area of the driver is distanced away from the surface of the substrate above the FBAR.

The at least one driver may include a plurality of anchors arranged on a surface of the substrate around the FBAR, a membrane distanced away from the surface of the substrate above the FBAR, and a plurality of connection members for connecting the membrane and the plurality of anchors to support the membrane, the plurality of connection members being deformed by the external signal to move the membrane toward the FBAR.

If a plurality of the drivers are provided, the drivers may be arranged in sequence with reference to a surface of the substrate above the FBAR such that the drivers are brought into contact with the FBAR in sequence by the external signal, thereby tuning the resonance frequency of the FBAR in a stepwise manner.

The plurality of drivers may have different areas exposed toward the surface of the substrate.

The tunable resonator may further include at least one electrode for causing the driver to be deformed.

The at least one driver may be of a bimetal structure that comprises two metals having different coefficients of thermal expansion.

The at least one driver may be thermally expanded and deformed when being heated by the external signal.

BRIEF DESCRIPTION OF THE DRAWINGS

The above and other aspects of the present invention will be more apparent by describing certain exemplary embodiments of the present invention with reference to the accompanying drawings, in which.

Throughout the drawings, the same drawing reference numerals will be understood to refer to the same elements, features, and structures.

DETAILED DESCRIPTION OF EXEMPLARY EMBODIMENTS

Certain exemplary embodiments of the present invention will now be described in greater detail with reference to the accompanying drawings.

The matters defined in the description such as a detailed construction and elements are provided to assist in a comprehensive understanding of the embodiments of the invention and are merely exemplary. Accordingly, those of ordinary skill in the art will recognize that various changes and modifications of the embodiments described herein can be made without departing from the scope and spirit of the invention. Also, descriptions of well-known functions and constructions are omitted for clarity and conciseness.

Figure 2A:
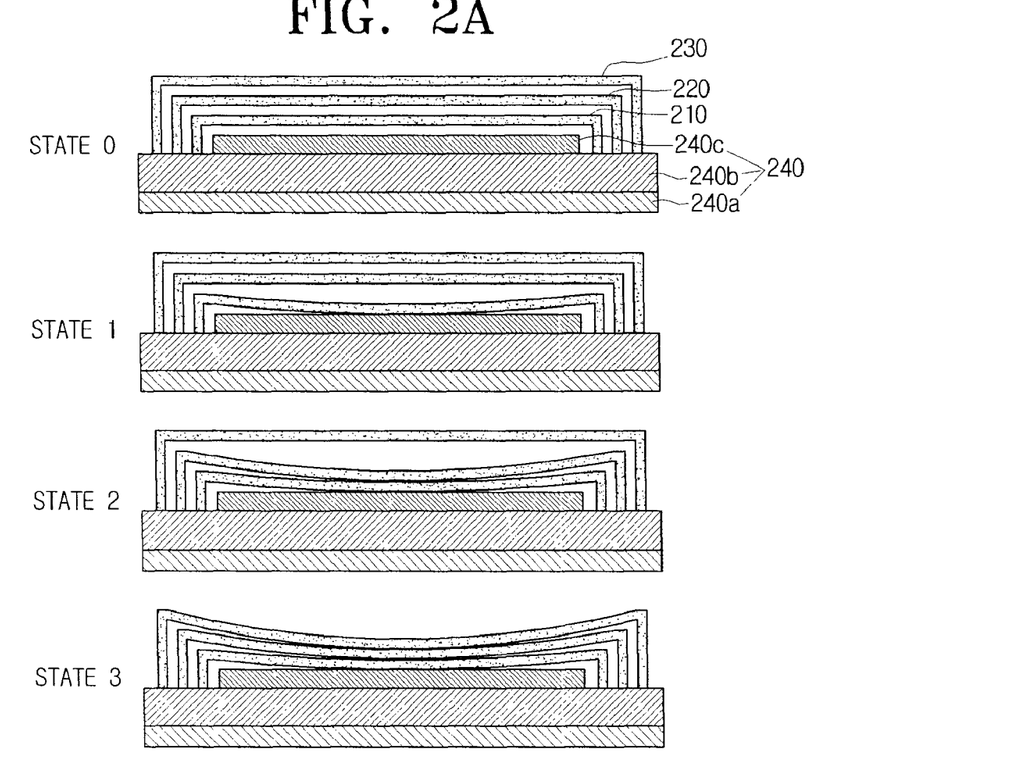
FIG. 2A is a view schematically illustrating a tunable resonator to explain an operation principle of the present invention.
Figure 2B:
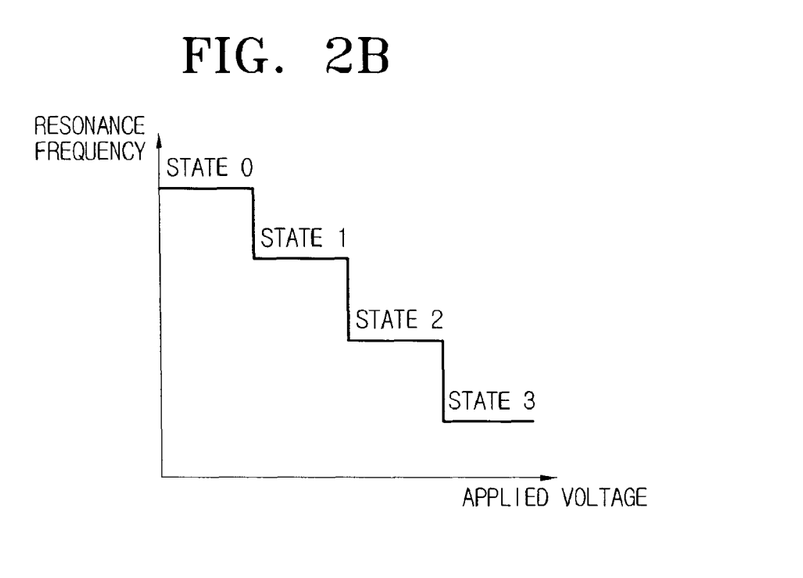
FIG. 2B is a graph illustrating changes of a resonance frequency according to changes of an applied voltage in the respective states of FIG. 2A.
Figure 2C:
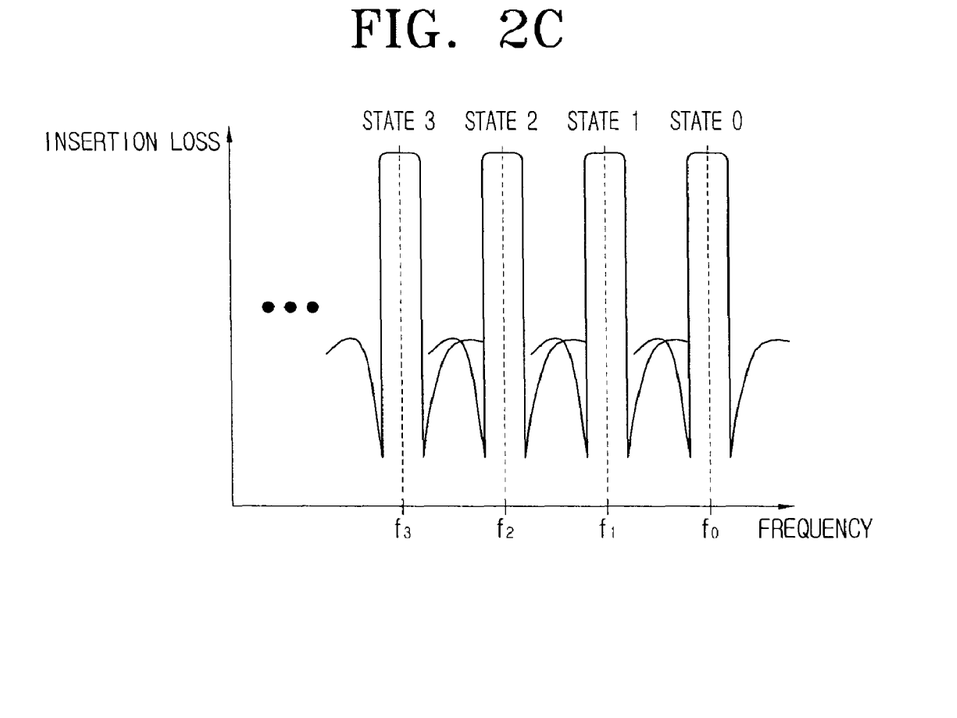
FIG. 2C is a graphs illustrating a frequency response in the respective states of FIG. 2A.

FIG. 2A is a view schematically illustrating a tunable resonator to explain an operation principle of the present invention, FIG. 2B is a graph illustrating changes of a resonance frequency according to changes of an applied voltage in the respective states of FIG. 2A, and FIG. 2C is a graphs illustrating a frequency response in the respective states of FIG. 2A.

Referring to FIG. 2A, a tunable resonator according to an exemplary embodiment of the present invention comprises a first driver 210, a second driver 220, a third driver 230, and a film bulk acoustic resonator (FBAR) 240. The FBAR 240 comprises a lower electrode 240a, a piezoelectric layer 240b, and an upper electrode 240c. The first through the third drivers 210, 220, 230 of the tunable resonator according to the exemplary embodiment of the present invention have to be deformed to contact with the FBAR 240. In deforming the first through the third drivers 210, 220, 230, various methods and materials, such as using an electrostatic force or a piezoelectric element or heating using a bimetal, can be used. Also, any type of FBAR that is well-known to an ordinary skilled person in the art can be used as the FBAR 240. In FIG. 2A, only a resonating unit of the FBAR 240 is illustrated and other elements such as an air gap or a reflection layer are omitted.

State "0" indicates that the FBAR 240 resonates at a predetermined resonance frequency $f_0$ and no driver is brought into contact with the FBAR 240. As a result, in state "0", the tunable resonator can filter a frequency band around the resonance frequency $f_0$ of the FBAR 240. State "1" indicates that a DC voltage greater than that of state "0" is applied to the first driver 210 and thus the first driver 210 is brought into contact with the upper electrode 240c of the FBAR 240, and that the FBAR 240 resonates along with the first driver 210 attached thereto. In this state, the resonance frequency of the tunable resonator decreases to $f_1$ (<$f_0$) due to a mass of the first driver 210. As a result, the tunable resonator can filter a frequency band around the resonance frequency $f_1$ in state "1". State "2" indicates that a voltage greater than that of state "1" is applied to the second driver 220, and as a result, the first and the second drivers 210, 220 are simultaneously brought into contact with the FBAR 240 and the FBAR 240 resonates along with the first and the second drivers 210, 220. Therefore, the resonance frequency of the tunable resonator further decreases to $f_2$ (<$f_1$) since the mass becomes heavier than in state "1". As a result, in state "2", the tunable resonator can filter a frequency band around the resonance frequency $f_2$. In the same way, the tunable resonator can filter a frequency band around the resonance frequency $f_3$ in state "3".

FIG. 2B illustrates changes of the resonance frequency, which becomes lower from states "0" to "3" because the drivers to be brought into contact with the FBAR 240 and to resonate along with the FBAR 240 are added from states "0" to "3". FIG. 2C illustrates frequency bands which are band-pass-filtered in respective states. It can be seen from FIG. 2C that insertion and skirt properties are improved and that the tunable resonator can fulfill a multiband operation. In FIGS. 2A to 2C, three (3) drivers are provided, but, even if 1 driver is provided, state "0" to "1" can be applied. Also, the present invention is applicable if four or more drivers are provided.

Figure 3A:
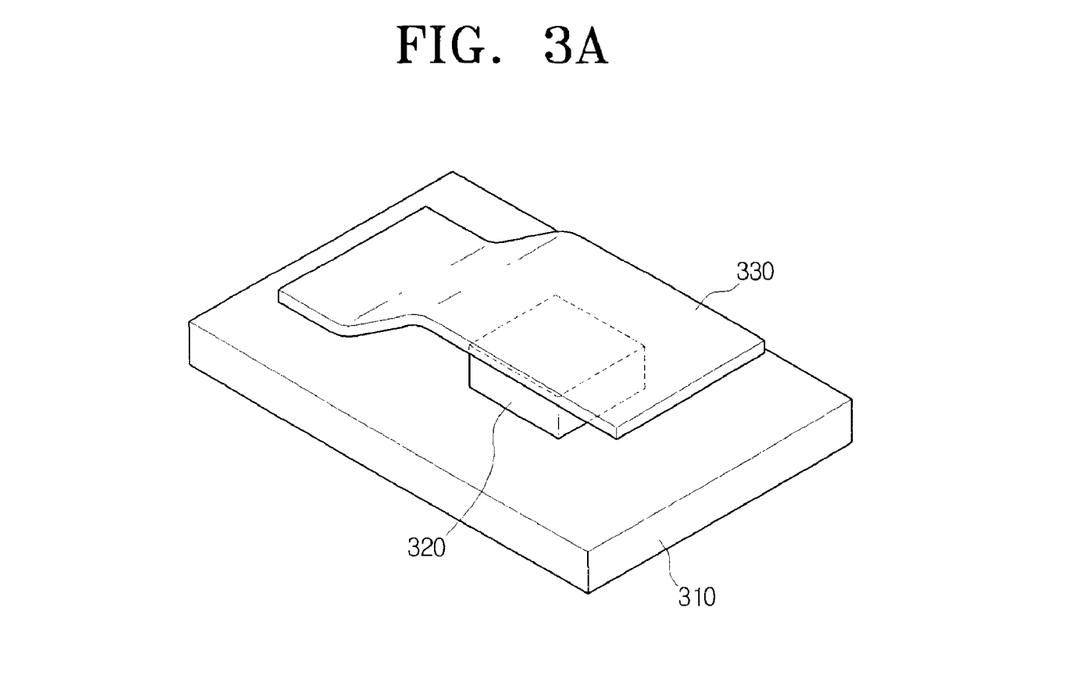
FIG. 3A is a view illustrating a tunable resonator according to an exemplary embodiment of the present invention.

FIG. 3A is a view illustrating a tunable resonator according to an exemplary embodiment of the present invention. Referring to FIG. 3A, a tunable resonator according to an exemplary embodiment of the present invention comprises a substrate 310, a FBAR 320, and a driver 330.

The substrate 310 supports the FBAR 320 and the at least one driver 330. Since the FBAR 320 and the driver 330 may be formed on the substrate 310 through a MEMS process the tunable resonator can be integrated into one-chip and thus a mass production of the tunable resonator is possible.

The FBAR 320 resonates.

The driver 330 is arranged at a side of the FBAR 320. The driver 330 is deformed by an external signal and is brought into contact with the FBAR 320, thereby changing a resonance frequency of the FBAR 320. More specifically, an area of the driver 330 is brought into contact with the FBAR 320 and the FBAR 320 resonates along with the driver 330 so that the resonance frequency can be tuned due to the addition of the mass of the driver 330.

One example of the tunable resonator is a cantilever-like resonator where the driver 330 has one end arranged on the substrate 310 and the other end distanced away from the upper portion of the FBAR 320. Also, the external signal may be a signal indicating a level of heat or voltage and therefore the driver 330 may be driven in various ways such as using an electrostatic force, using a piezoelectric effect, using a heating method, and using an electromagnetic force. For example, the driver 330 of the tunable resonator may be an actuator which is deformable when being applied with a voltage. Also, any type of actuator such as unimorph type polymer actuator or bimorph type polymer actuator can be applied. Also, the driver 330 may be deformed and brought into contact with the FBAR 320 due to a heat expansion when being applied with the external signal.

Also, the FBAR 320 and the driver 330 may be formed after an insulation layer (not shown) is formed on the substrate 310. All types of FBAR that are well-known to an ordinary skilled person in the art can be used as the FBAR 320, and although the FBAR 320 is simply illustrated as one block, various processes such as forming an air gap (not shown) on the substrate 310 under the FBAR 320 for resonation may be required. Also, the tunable resonator provides only one driver 330 as illustrated in FIG. 3A, but practically, a plurality of drivers may be provided to fulfill a multiband operation of varying the frequency band as shown in FIG. 3B.

Figure 3B:
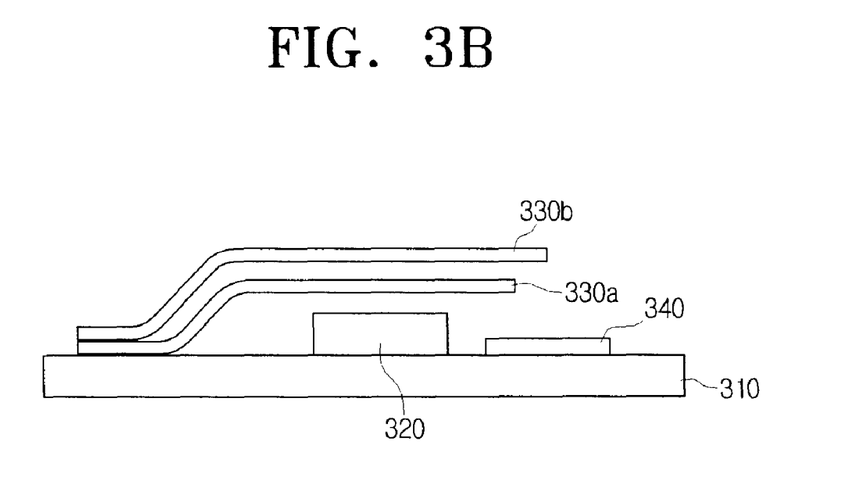
FIG. 3B is a view illustrating a variant of the tunable resonator of FIG. 3A.

FIG. 3B is a view illustrating a variant of the tunable resonator of FIG. 3A. Referring to FIG. 3B, as a variant, the tunable resonator according to the exemplary embodiment of the present invention comprises a substrate 310, a FBAR 320, a first driver 330a and a second driver 330b, and an electrode 340. The first and the second drivers 330a, 330b are arranged in sequence with reference to a surface of the substrate 310 and accordingly are brought into contact with the FBAR 320 in sequence according to a magnitude of an external signal so that a resonance frequency of the FBAR 320 can be tuned in a stepwise manner. The electrode 340 may be made of a metal. The tunable resonator may comprise a plurality of electrodes and in this case it can deform the drivers more easily than in the case where a single electrode is used.

Figure 3C:
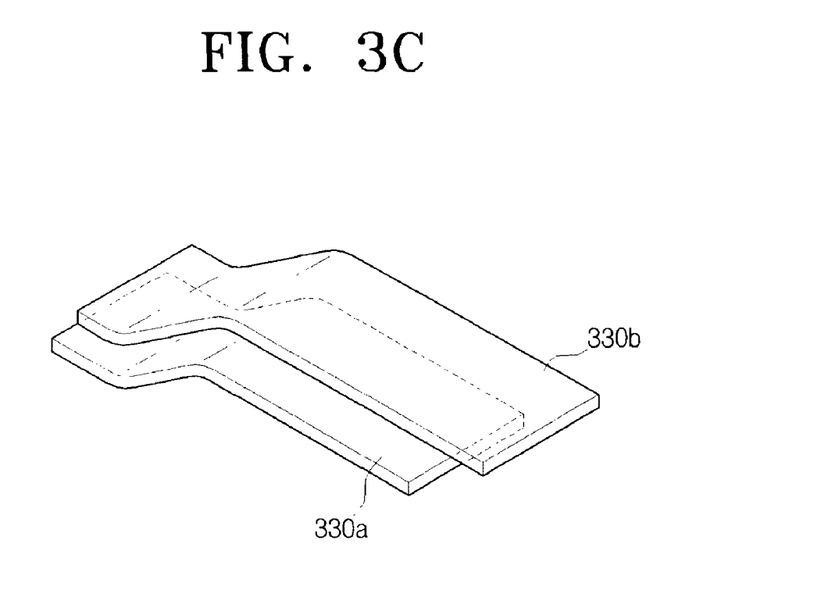
FIG. 3C is a view illustrating an example of a plurality of drivers of FIG. 3B.

FIG. 3C is a view illustrating an example of the plurality of drivers of FIG. 3B. Referring to FIGS. 3B and 3C, one ends of the first and the second drivers 330a, 330b, which are of cantilever types, are arranged on the substrate 310 in contact with each other, whereas the other ends of the first and the second drivers 330a, 330b are distanced away from each other by a predetermined distance. In this example, the first and the second drivers 330a, 330b are misaligned with each other along the length such that they have different areas exposed toward the substrate 310. Therefore, various forces effected by the external signal are exerted between the electrode 340 and the second driver 330b in addition to between the electrode 340 and the first driver 330a, thereby deforming the second driver 330b. In FIG. 3C, only the first and the second drivers 330a, 330b are illustrated by way of an example, but this should not be considered as limiting. Three or more drivers can be provided according to a frequency to be filtered.

Figure 3D:
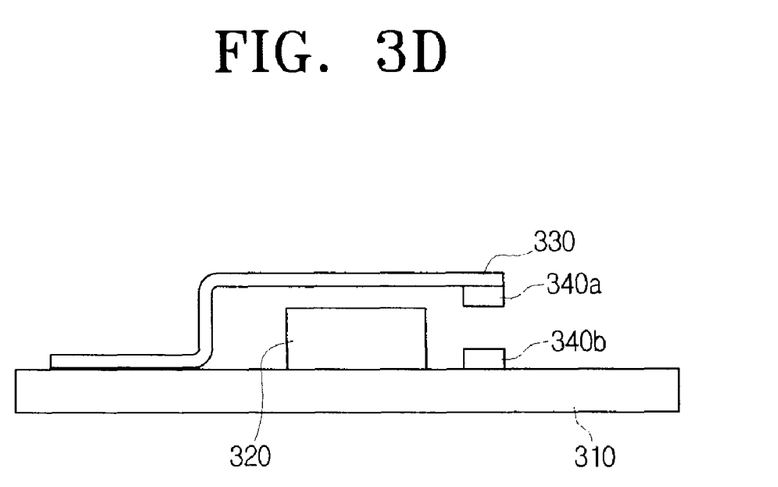
FIG. 3D is a view illustrating another variant of the tunable resonator of FIG. 3A.

FIG. 3D is a view illustrating another variant of the tunable resonator according to the exemplary embodiment of the present invention. Referring to FIG. 3D, as another variant, the tunable resonator comprises a substrate 310, a FBAR 320, a driver 330, and an upper driving electrode 340a attached on an lower side of the driver 330 and a lower driving electrode 340b attached on the substrate 310. In this example, the driver 330 is made of a dielectric material and the upper driving electrode 340a is attached to a lower side of one end of the driver 330. Accordingly, an electrostatic force is exerted between the upper driving electrode 340a and the lower driving electrode 340b, causing the driver 330 to be deformed.

Figure 3E:
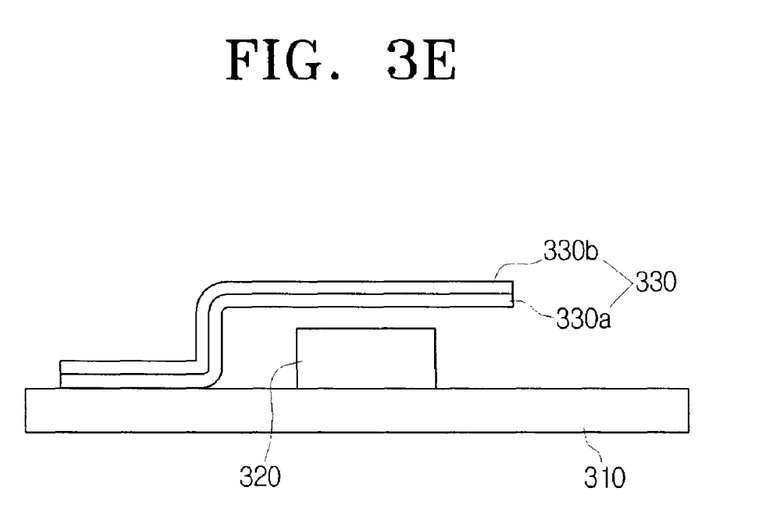
FIG. 3E is a view illustrating still another variant of the tunable resonator of FIG. 3A.

FIG. 3E is a view illustrating still another variant of the tunable resonator according to the exemplary embodiment of the present invention. Referring to FIG. 3E, as still another variant, the tunable resonator comprises a substrate 310, a FBAR 320, and a driver 330. As shown in FIG. 3E, the driver 330 is formed as a bimetal structure comprising a first metal 330a and a second metal 330b. One end of the driver 330 has to be deformed in a downward direction in order to be brought into contact with the FBAR 320 and to resonate along with the FBAR 320. Therefore, the lower first metal 330a may be made of a Ni—Fe alloy which has a low coefficient of thermal expansion, whereas the upper second metal 330b may be made of Ni—Mn—Fe alloy, a Ni—Mo—Fe alloy, a Ni—Mn—Cu alloy and/or the like which have a high coefficient of thermal expansion.

Figure 4A:
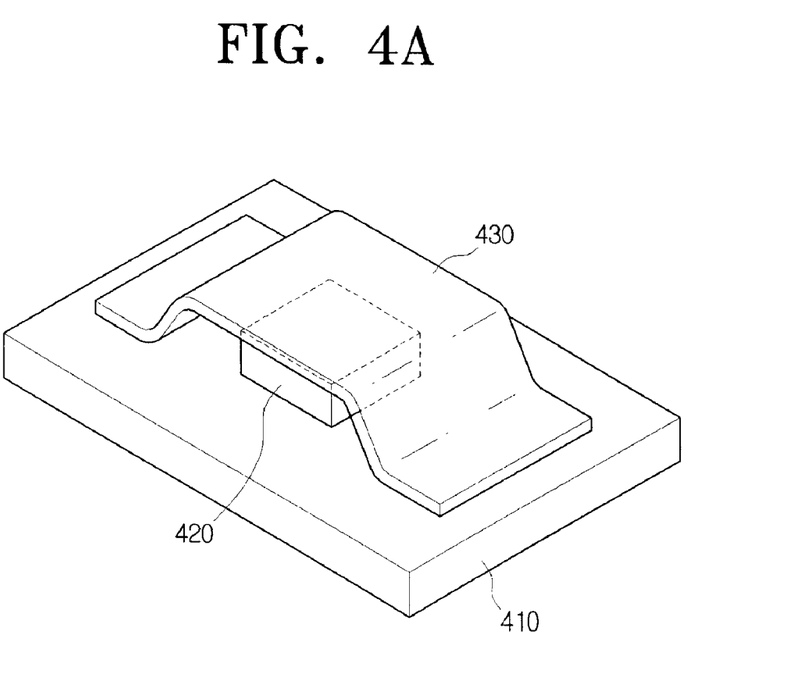
FIG. 4A is a view illustrating a tunable resonator according to another exemplary embodiment of the present invention.
Figure 4B:
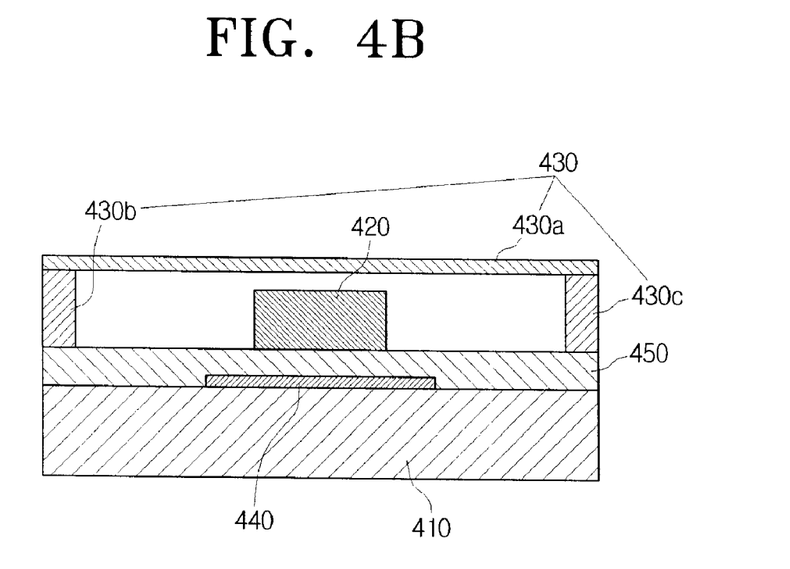
FIG. 4B is a view illustrating a variant of the tunable resonator of FIG. 4A.
Figure 4C:
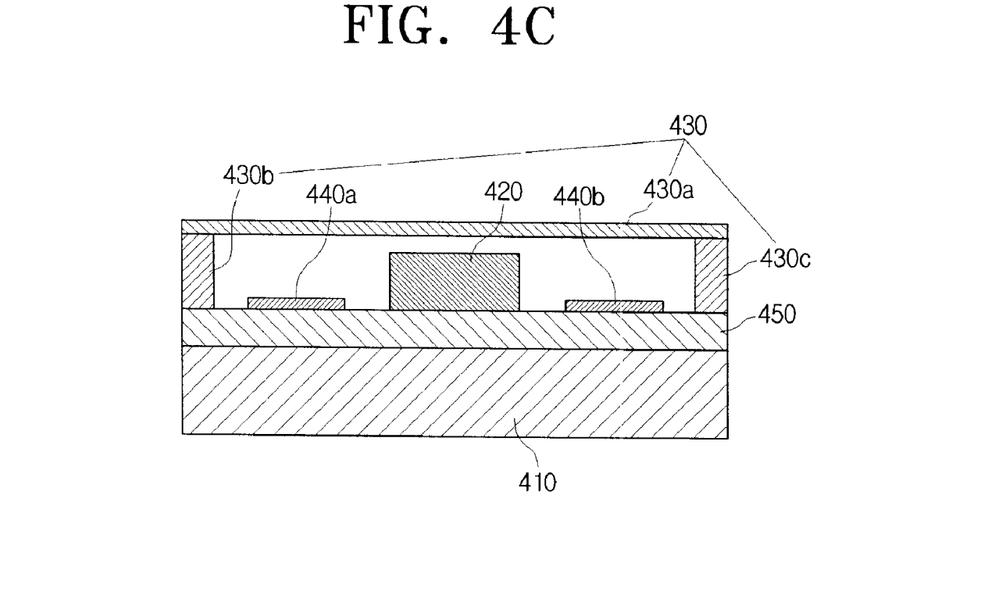
FIG. 4C is a view illustrating another variant of the tunable resonator of FIG. 4A.

FIG. 4A is a view illustrating a tunable resonator according to another exemplary embodiment of the present invention, and FIGS. 4B and 4C are views illustrating variants of the tunable resonator of FIG. 4A. In FIGS. 4A to 4C, a single driver 430 are illustrated but in order to realize a filter capable of tuning to a multiband, a plurality of drivers may be provided.

Referring to FIG. 4A, a tunable resonator according to another exemplary embodiment of the present invention comprises a substrate 410, a FBAR 420, and a driver 430. The driver 430 is in a bridge shape such that it has opposite ends contacting with a surface of the substrate 410 and has an area distanced away from the surface of the substrate 410 above the FBAR 420.

As a variant, the tunable resonator comprises a substrate 410, a FBAR 420, a driver including elements marked 430a, 430b, and 430c, an electrode 440, and an insulation layer as shown in FIG. 4B. Unlike the driver 430 in FIG. 4A, the driver 430 of FIG. 4B comprises a horizontal area 430a and a plurality of anchors 430b, 430c for supporting the horizontal area 430a. Only if an electrostatic force is exerted between the horizontal area 430a and the electrode 440 and thus it makes it possible to bring the horizontal area 430a of the driver 430 into contact with the FBAR 420 and to cause the FBAR 420 to resonate along with the horizontal area 430a, the tunable resonator can be modified in various ways to include the anchors 430b, 430c. Also, the insulation layer 450 electrically insulates the FBAR 420 and the electrode 440 from each other so as to enhance the resonating performance of the FBAR 420.

As another variant, the tunable resonator comprises a plurality of electrodes 440a and 440b arranged on an insulation layer 450 as shown in FIG. 4C. In this example, since an electrostatic force is exerted between opposite ends of an area 430a of a driver 430 and the plurality of electrodes 440a, 440b, the area 430a of the driver 430 is deformed more efficiently than in the case where a single electrode is used.

Figure 5:
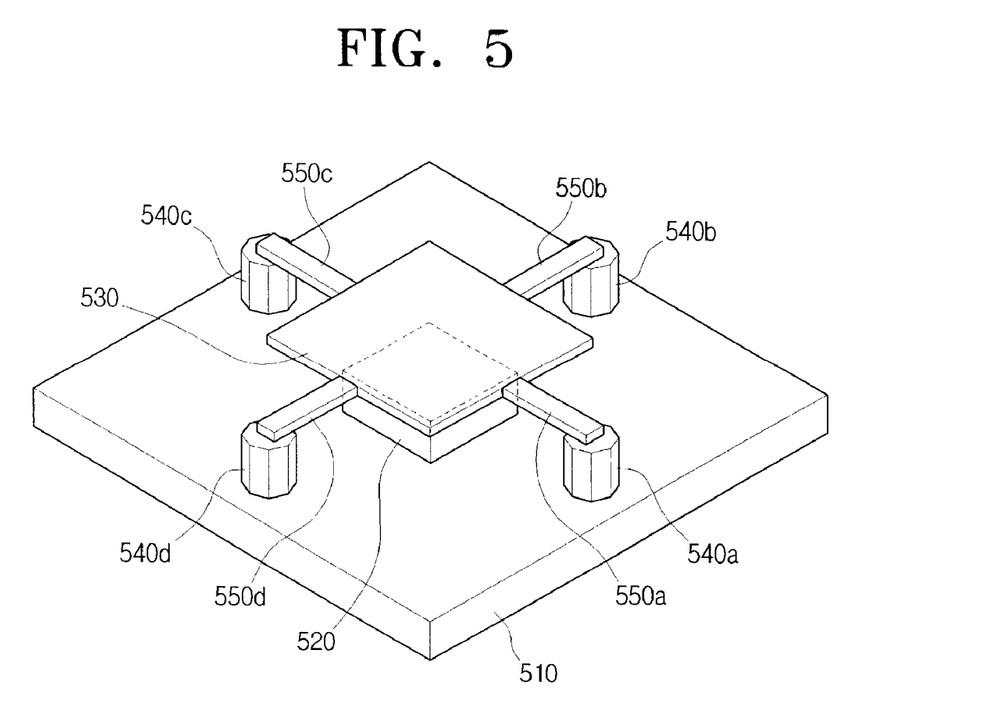
FIG. 5 is a view illustrating a tunable resonator according to still another exemplary embodiment of the present invention.

FIG. 5 is a view illustrating a tunable resonator according to still another exemplary embodiment of the present invention. Referring to FIG. 5, a tunable resonator according to still another exemplary embodiment of the present invention comprises a substrate 510, a FBAR 520, and a driver including elements marked 530, 540, 550. More specifically, the driver comprises a membrane 530, a plurality of anchors 540a, 540b, 540c, 540d, and a plurality of connection members 550a, 550b, 550c, 550d. The membrane 530 is distanced away from a surface of the substrate 510 above the FBAR 520. The plurality of anchors 540a, 540b, 540c, 540d are arranged on the surface of the substrate 510 around the FBAR 520. The plurality of connection members 550a, 550b, 550c, 550d connect the membrane 530 to the plurality of anchors 540a, 540b, 540c, 540d to support the membrane 530 and are deformed by an applied external signal to move the membrane 530 toward the FBAR 520. In FIG. 5, one driver including elements marked 530, 540, 550 is illustrated but a plurality of drivers may be formed to realize a resonator capable of tuning to a multiband.

A RF tunable filter can be realized using the above-described RF tunable resonator and a RF duplexer can be realized using the RF tunable resonator. That is, since the RF tunable filter and the RF duplexer can be realized using a single RF tunable filter instead of the plurality of RF filters shown in FIG. 1, a compact-sized RF filter and a compact-sized duplexer can be achieved.

While the invention has been shown and described with reference to certain embodiments thereof, it will be understood by those skilled in the art that various changes in form and details may be made therein without departing from the spirit and scope of the invention as defined by the appended claims and the full scope of equivalents thereof.

What is claimed is:
1. A tunable resonator, comprising:
a film bulk acoustic resonator (FBAR) arranged on a substrate; and
a plurality of drivers arranged on the substrate and at least in part above the FBAR in such a manner the drivers are deformed and thereby brought into contact with the FBAR sequentially in response to an external signal so as to vary the resonance frequency of the FBAR in a stepwise manner.

2. The tunable resonator of claim 1, wherein each of the plurality of drivers is of a cantilever structure having one end thereof supported by the substrate and the other end thereof spaced apart from the substrate and above the FBAR.

3. The tunable resonator of claim 1, wherein each of the plurality of drivers is of a bridge structure having opposite ends thereof in contact with a surface of the substrate and a portion thereof intermediate the opposite ends spaced apart from the surface of the substrate and above the FBAR.

4. The tunable resonator of claim 1, wherein each of the plurality of drivers comprises:
   a plurality of anchors arranged on the substrate around the FBAR;
   a membrane spaced apart from the substrate and above the FBAR; and
   a plurality of connection members connecting the membrane to the plurality of anchors, the plurality of connection members being deformable responsive to the external signal to thereby cause the membrane to move toward the FBAR.

5. The tunable resonator of claim 1, wherein the plurality of drivers have different respective areas that are exposed to face a surface of the substrate.

6. The tunable resonator of claim 1, wherein at least one of the plurality of drivers has a bimetal structure that comprises two metals having different coefficients of thermal expansion.

7. A tunable resonator, comprising:
   a film bulk acoustic resonator (FBAR) for performing a resonance;
   at least one driver which is arranged at a side of the FBAR and is deformed and brought into contact with the FBAR by an external signal, thereby changing a resonance frequency of the FBAR; and
   a substrate for supporting the FBAR and the at least one driver,
   wherein the at least one driver is of a cantilever structure such that one end of the driver is in contact with a surface of the substrate and the other is distanced away from the surface of the substrate above the FBAR, and
   wherein the at least one driver is of a bimetal structure that comprises two metals having different coefficients of thermal expansion.

8. The tunable resonator of claim 7, wherein the at least one driver comprises a plurality of drivers arranged in sequence with reference to the surface of the substrate above the FBAR so that the drivers are brought into contact with the FBAR in sequence by the external signal to thereby tune the resonance frequency of the FBAR in a stepwise manner.

9. The tunable resonator of claim 8, wherein the plurality of drivers have respective areas exposed toward the surface of the substrate different from one another.

10. The tunable resonator of claim 7, further comprising at least one electrode for causing the at least one driver to be deformed.

11. The tunable resonator of claim 7, wherein the at least one driver is thermally expanded and deformed when being heated by the external signal.

12. A tunable resonator comprising:
   a film bulk acoustic resonator (FBAR) for performing a resonance;
   at least one driver which is arranged at a side of the FBAR and is deformed and brought into contact with the FBAR by an external signal, thereby changing a resonance frequency of the FBAR; and
   a substrate for supporting the FBAR and the at least one driver,
   wherein the at least one driver comprises:
      a plurality of anchors arranged on a surface of the substrate around the FBAR;
      a membrane distanced away from the surface of the substrate above the FBAR; and
      a plurality of connection members for connecting the membrane and the plurality of anchors to support the membrane, the plurality of connection members being deformed by the external signal to move the membrane toward the FBAR.

13. The tunable resonator of claim 12, wherein the at least one driver comprises a plurality of drivers arranged in sequence with reference to the surface of the substrate above the FBAR so that the drivers are brought into contact with the FBAR in sequence by the external signal to thereby tune the resonance frequency of the FBAR in a stepwise manner.

14. The tunable resonator of claim 13, wherein the plurality of drivers have respective areas exposed toward the surface of the substrate that are different from one another.

15. The tunable resonator of claim 12, further comprising at least one electrode for causing the driver to be deformed.

16. The tunable resonator of claim 12, wherein the at least one driver is of a bimetal structure that comprises two metals having different coefficients of thermal expansion.

17. The tunable resonator of claim 12, wherein the at least one driver is thermally expanded and deformed when being heated by the external signal.

* * * * *